United States Patent [19]

Onuki et al.

[11] Patent Number: 5,019,891
[45] Date of Patent: May 28, 1991

[54] SEMICONDUCTOR DEVICE AND METHOD OF FABRICATING THE SAME

[75] Inventors: Jin Onuki; Yasushi Koubuchi; Shinichi Fukada, all of Hitachi; Katuhiko Shiota, Ibaraki; Kunio Miyazaki, Hitachi; Tatsuo Itagaki, Tokyo; Genji Taki, Hitachi, all of Japan

[73] Assignee: Hitachi, Ltd., Tokyo, Japan

[21] Appl. No.: 296,003

[22] Filed: Jan. 12, 1989

[30] Foreign Application Priority Data

Jan. 20, 1988 [JP] Japan ................................. 63-8349
Mar. 15, 1988 [JP] Japan ................................. 63-59451

[51] Int. Cl.$^5$ .................... H01L 23/48; H01L 29/44; H01L 29/52; H01L 29/60
[52] U.S. Cl. ............................. 357/70; 357/65; 357/67; 357/71; 357/72; 428/620; 428/632; 428/634
[58] Field of Search ................. 357/70, 71, 72, 65, 357/67; 428/620, 632, 634

[56] References Cited

U.S. PATENT DOCUMENTS

| | | | |
|---|---|---|---|
| 3,725,309 | 4/1973 | Ames et al. | 252/512 |
| 4,065,781 | 12/1977 | Gutnecht | 357/23 |
| 4,127,424 | 11/1978 | Ullery, Jr. | 136/89 P |
| 4,800,419 | 1/1989 | Long et al. | 357/70 |
| 4,827,326 | 5/1989 | Altman et al. | 357/67 |
| 4,843,453 | 6/1989 | Hopper et al. | 357/71 |

FOREIGN PATENT DOCUMENTS 0026640 2/1985 Japan .
0144847 7/1986 Japan .
0079950 4/1988 Japan .

OTHER PUBLICATIONS

Kobuchi et al., "Development of Corrosion Resistant Al Alloy Conductor for Semiconductors", ELS, 172nd, vol. 87-2, #280, pp. 396-397.

Primary Examiner—Rolf Hille
Assistant Examiner—David Ostrowski
Attorney, Agent, or Firm—Antonelli, Terry, Stout & Kraus

[57] ABSTRACT

A semiconductor device and the method of fabricating the semiconductor device include a semiconductor substrate and a plurality of conductor films formed on the substrate. Each of the conductor films is made of aluminum alloy including at least one element selected from palladium and platinum and, more preferably, further including at least one element selected from lithium, beryllium, magnesium, manganese, iron, cobalt, nickel, copper, lanthanum, cerium, chromium hafnium, zirconium, cadmium, titanium, tungsten, vanadium, tantalum, and niobium, with a protective film which includes oxide of the selected one of palladium and platinum being formed on the side wall of the conductor film.

39 Claims, 17 Drawing Sheets

AT 450°C FOR 30 MINUTES,
THEN COOLED QUICKLY

AT 450°C FOR 30 MINUTES, THEN COOLED
QUICKLY. AT 300°C FOR 1 HOUR, AND
AT 350°C FOR 1 HOUR.

AT 100°C FOR
600 MINUTES

AT 200°C FOR
10 MINUTES

AT 300°C FOR
10 MINUTES

AT 400°C FOR
10 MINUTES (CONDITION OF SECOND HEAT PROCESS)

FIG. 16

| WIRE LIFE (hr) | 1 | 10 | 100 | 1000 | 10000 |
|---|---|---|---|---|---|
| Aℓ-1wt%Si | ▨ | | | | |
| Aℓ-1%Si-0.3%Pd | ▨▨▨▨▨ | | | | |
| Aℓ-1%Si-0.3%Pt | ▨▨▨▨ | | | | |
| Aℓ-1%Si-0.3%Pd-0.3%Li | ▨▨▨▨▨▨▨▨▨ | | | | |
| Aℓ-1%Si-0.3%Pd-0.3%Be | ▨▨▨▨▨▨▨▨▨▨ | | | | |
| Aℓ-1%Si-0.3%Pd-0.3%Mg | ▨▨▨▨▨▨▨▨▨▨ | | | | |
| Aℓ-1%Si-0.3%Pd-0.3%Mn | ▨▨▨▨▨▨▨▨▨ | | | | |
| Aℓ-1%Si-0.3%Pd-0.3%Fe | ▨▨▨▨▨▨▨▨▨▨ | | | | |
| Aℓ-1%Si-0.3%Pd-0.3%Co | ▨▨▨▨▨▨▨▨▨ | | | | |
| Aℓ-1%Si-0.3%Pd-0.3%Ni | ▨▨▨▨▨▨▨▨ | | | | |
| Aℓ-1%Si-0.3%Pd-0.3%Cu | ▨▨▨▨▨▨▨▨▨ | | | | |
| Aℓ-1%Si-0.3%Pd-0.3%La | ▨▨▨▨▨▨▨ | | | | |
| Aℓ-1%Si-0.3%Pd-0.3%Ce | ▨▨▨▨▨▨▨▨▨ | | | | |

TEST TEMPERATURE : 150°C
CURRENT DENSITY : $8 \times 10^6$ A/cm$^2$

ANNEALING AT 430°C, 60 MIN.
PRECIPITATION AT 350°C, 30 MIN.
SOLID SOLUTION RE-HEAT AT
    430°C, 5 MIN.

Aℓ-1%Si-0.3%Pd-0.3%Cu

ANNEALING AT 450°C, 60 MIN.

Aℓ-1%Si-0.3%Pd-0.3%Cu

ANNEALING AT 450°C, 60 MIN.

Aℓ-1%Si

ANNEALING AT 450°C, 60 MIN.

Aℓ-1%Si-0.3%Pd

SEMICONDUCTOR DEVICE AND METHOD OF FABRICATING THE SAME

BACKGROUND OF THE INVENTION

1. Field of the Invention

This invention relates to a semiconductor device, and particularly to a conductor film and fabricating method therefor applied suitably to large scale integration (LSI) circuit devices.

2. Description of the Prior Art

Among the known conductor film materials used for integrated circuit devices are aluminum to which is added a small quantity of copper, and aluminum to which is added a small quantity of silicon or precious metal. The conductor film of aluminum to which is added a small quantity of copper is described in U.S. Pat. No. 3,725,309 as being excellent in resistivity against electromigration, i.e. in the effectiveness of preventing the breakage of conductor film attributable to electromigration.

The conductor of a semiconductor device is generally made of aluminum to which is added several percent of silicon. When the device is operated to conduct a large current at a high temperature, the current flowing in the aluminum conductor film causes atoms of the film to move, resulting in the formation of hillocks in one section and voids in another section of the conductor film. A grown hillcock causes a short-circuit between interconnecting conductors, while a grown void causes an increased resistance of conductor at the portion of void and eventually a failure of conductor by heat generation, and both cases result in a malfunctioning of the semiconductor device.

In order to overcome the problem of electromigration, according to the above U.S. Patent, 0.1–54 weight-% of copper is added to aluminum so that a precipitation structure of $CuAl_2$ particles is formed. The particles precipitate at grain boundaries and grain boundary triple points of the aluminum matrix to prevent the movement of aluminum atoms, and consequently the semiconductor device can have an extended life against electromigration. However, $CuAl_2$ is highly apt to segregate, and the semiconductor device suffers a premature failure due to electromigration at portions where $CuAl_2$ is not precipitated.

Al—Cu alloy exhibits difficulty in fine pattern formation using dry etching, and is corroded severely by Cl and residual $Cl^{31}$ ion during processing, and therefore it is extremely difficult to have a forming accuracy of 1 $\mu m$ or submicron pattern. Another problem in the operation of the semiconductor device is the reliability under humid conditions.

The Al conductor film is coated with a passivation film for surface protection, which exerts a tensional stress on the conductor film until it is broken, and this defect caused by so-called stress migration is also a problem. Specifically, the Al—Cu conductor, which has a poor pattern accuracy, is prone to break at a narrow portion.

Japanese Patent Unexamined Publication JP-A-60-26640 discloses conductor materials consisting of aluminum, precious metals (Pt, Pd, Rh, Ir) and silicon, and another Japanese Patent Unexamined Publication JP-A-61-144847 discloses a semiconductor device having a conductor film formed of alloy including at least one of Pd and Pt by 0.1–2 weight-% and precipitated in the form of metal or compound. These wiring film materials are deposited on a semiconductor substrate by evaporative deposition or sputtering, and then formed into an intended pattern mainly by the wet-etching process.

In the conventional technique, where the Al conductor film has an enhanced electromigration resistance by the addition of Cu to Al, the segregation of Cu is yet unconsidered, resulting in a significant variability of life time among production lots. Since Al—Cu alloy is less resistive against corrosion, it is unfavorable for fine pattern formation by dry etching or wet etching, and also suffers a so-called migration problem in which the film is broken at a defective portion created in the etching process under the stress caused by the passivation film.

The materials and devices in the above-mentioned Japanese Patent Unexamined Publication JP-A-60-26640 and No. 61-144847 are also in need of improvement of resistances against electromigration and stress migration.

The foregoing conventional techniques do not consider patterning of the conductor film materials by dry etching and problems encountered in the process. The Japanese Patent Unexamined Publication JP-A-61-144847 mentions dry etching, but discloses nothing about associated problems.

The inventors of the present invention has found the fact that when an aluminum conductor film or aluminum-based alloy conductor film including a small quantity of precious metal, silicon, copper, etc. added to aluminum is subjected to dry etching, the conductor film has its side wall etched slantwise (will be termed "side etching"), creating a difference in the pattern profile between the top and bottom line width. Although wet etching is free from the side etching problem, it is merely capable of forming lines down to several $\mu m$ at most and is not suited for fine pattern formation of 1 $\mu m$ or smaller.

With the intention of further increasing the integration density of LSI devices, the line width of conductor film has come to be narrower, and the etching technique capable of pattern formation with a line width of 1.3 $\mu m$ or less would be increasingly important.

SUMMARY OF THE INVENTION

An object of this invention is to provide a method of fabricating a semiconductor device having a conductor film on a semiconductor substrate, in which the occurrence of side etching in the dry etching process of conductor film is prevented.

Another object of this invention is to provide a semiconductor device having on its semiconductor substrate a conductor film for which the occurrence of side controlled is prevented or significantly etching.

A further object of this invention is to provide a semiconductor device having its conductor film prevented or significantly controlled from the occurrence of side etching thereby to accomplish fine conductor formation.

A further object of this invention is to provice a semiconductor device and a fabricating method therefor having an improved fine pattern formation property for an Al conductor film and high resistances against electromigration and stress migration.

The invention resides in a semiconductor device having a conductor film of aluminum-based alloy on a semiconductor substrate, in which a layer of material including the element included in the conductor film material is formed on the side wall of the conductor film. The layer is formed through deposition of conductor film material on the semiconductor substrate, annealing, and dry etching.

According to the invention, in order to ensure the dimensional accuracy of fine-formed Al conductors, palladium, platinum, or palladium and silicon, as an alloy element for enhancing the corrosion resistance, is dispersed uniformly in the Al conductor film. This preprocessing facilitates the fine pattern formation of the Al conductor film. By the addition of palladium, platinum, or palladium and silicon by 5% or less, the resistivity against electromigration is also improved. Preferably, for the improvement of the resistivity against stress migration, at least one of lithium, beryllium, magnesium, manganese, iron, cobalt, nickel, copper, lanthanum, chrome, hafnium, zirconium, cadmium, titanium, tungsten, vanadium, tantalum, niobium, and cerium by a quantity of less than 5% is added besides palladium or platinum.

A thin film of Al alloy of the above-mentioned composition is deposited on a semiconductor substrate by chemical vapor deposition (CVD), electron beam deposition or sputtering, and thereafter a prescribed heat process is conducted. Consequently, in the following dry etching process for forming a conductor pattern, a layer of material including the element included in the conductor film material is re-deposited on the side wall, and side etching on the conductor pattern is prevented or suppressed. This layer is mainly made of oxide of Pd or Pt and material including C included in the gas or resist used for etching, and has a thickness of 100 nm or less, preferably.

The quantity of specific additive element in the aluminum-based alloy is not very crucial for the formation of the side etching preventive layer on the side wall of the conductor film. A crucial point is that the specific additive element is included in the aluminum-based alloy, and the element reacts with oxygen or other gas in the etching atmosphere to yield a layer of material which is different from the aluminum-based alloy. The quantity of additive element required to exist in the aluminum-based alloy was found to be low actually, as shown in Table 1.

According to the inventive semiconductor fabricating method, the conductor film material an aluminum-based alloy with the compositions mentioned above is deposited on a semiconductor substrate, thereafter a heat process is conducted, and finally dry etching is conducted to form an intended conductor pattern. During the dry etching process, a protective layer including the oxide of Pd or Pt, which is a composition of the conductor film material, and C is formed on the side wall of the conductor pattern, so that side etching of the conductor pattern is prevented or suppressed during dry etching.

As a heat process for the conductor film material deposited on the semiconductor substrate, annealing is optimal. Two-stage annealing is preferable, in which the substrate is heated to 200°–500° C., then it is cooled down quickly to room temperature, and again it is heated to a temperature not in excess of 350° C., preferably 150°–350° C. The latter heating stage of 350° C. or lower may take place in several cycles dividedly. The duration of heating is preferably 3 to 180 minutes for the former stage of 200°–500° C. and 10 to 600 minutes for the latter stage of 350° C. or lower. In case of multiple heat cycles for the latter annealing stage, the total time length of heating is in the range of 10 to 600 minutes, preferably.

The layer created on the side wall of the conductor pattern through the annealing and succeeding dry etching serves to prevent hillocks which can cause short-circuit. Also, the layer has corrosion resistance against molding resin, and it serves as a protective layer when the passivation film which covers the conductor film has been broken by corrosion by components in the resin.

It was confirmed that when the additive element of the aluminum-based alloy includes palladium, platinum, or palladium and silicon, a layer which includes the oxide of palladium or platinum, and carbon is created on the side wall of conductor film in the dry etching process, and that the layer has a thickness of 100 nm or less.

It was further confirmed that when an aluminum alloy including Pd or Pt is subjected to dry etching by skipping the annealing process, the etched surface has a creation of a compound of aluminum with Pd or Pt besides PdO or PtO, and the compound is corroded by chlorine (Cl) in the etching gas thereby to cause side etching.

Through the annealing of the aluminum alloy film including Pd or Pt and then the dry etching process after the compound of aluminum with Pd or Pt has precipitated, precipitation of the Al with Pd or Pt compound during dry etching is prevented, and side etching can be suppressed. On this account, the above-mentioned two-stage heating is desirable as annealing.

The aluminum alloy including Pd or Pt is preferably an aluminum-based alloy including 5 weight-% of Pd or Pt, or an aluminum-based alloy including 0.01-3 weight-% of Pd and 0.1-3 weight-% of silicon.

Preferable methods of depositing the conductor film material on a semiconductor substrate include chemical vapor deposition (CVD), electron beam deposition and sputtering, as mentioned previously. Specifically, the sputtering method forces Pd or Pt to form a solid solution in the aluminum alloy, which facilitates precipitation of the compound of aluminum with Pd or Pt in the following heat process.

The inventive semiconductor device is useful in a structure in which the semiconductor substrate having conductor films is placed on a lead frame, with electrical connection being made between the lead frame and the conductor films using metallic wires, or in a structure in which the above-mentioned assembly is sealed with resin. The inventive semiconductor structure is useful for integrated circuits (ICs), hybrid ICs and large-scale integration (LSI) circuits.

The inventive technique prevents side etching of the conductor film caused by dry etching, and this enables a smaller line width of the conductor film and eventually enhances the integration density of IC and LSI devices.

Since the conductor film is rectangular in cross section, it is possible to make a line width of 1.3 $\mu$m or less and a line width vs. line spacing ratio of 1 or less, and this enables higher integration. The aluminum alloy conductor including Pd or Pt improves the resistance against migration and the property of contact between the semiconductor substrate and conductor film at the same time.

The inventive semiconductor device is applicable to computers, personal computers and word processors, although it is not confined to these applications.

The following describes the reason for the improvement in the property of fine pattern formation of conductor film, the property against electromigration, and the property of contact with the semiconductor substrate, by taking an example of an aluminum alloy conductor including palladium.

(1) Property of fine pattern formation

When an aluminum conductor film is made to include palladium as much as the limit of solid solution or more relative to aluminum, specifically 0.01 weight-% or more, a thin uniform film of palladium oxide is created in the surface aluminum oxide film on the aluminum alloy conductor film. The palladium oxide has extremely high corrosion resistance against Cl gas used in dry etching, and it prevents portions other than the etching surface from being sublimated as $AlCl_3$ during the dry etching process.

In the process of dry etching, the etching gas including Cl destroys the alumina film over the conductor film and combines with Al to sublimate as $AlCl_3$. Due to the presence of Pd in the Al conductor, a Pd oxide layer is created in the alumina film, and it serves to protect portions other than etching portions against the etching gas.

By conducting a heat process for precipitating the compound of Al with Pd in the conductor film, the compound precipitates mainly in crystal grain boundaries of the aluminum alloy, and Pd which has not combined with Al disperses finely in aluminum grains. During the dry etching process, the residual Pd combines with oxygen in the atmosphere to yield a thin layer of Pd oxide on the side wall of the etching surface and it retards side etching.

The successful retardation of side etching realizes fine pattern formation that is a merit of dry etching. According to this invention, a fine conductor with a line width of 1.3 μm or less, specifically 0.5–1.3 μm, which is almost infeasible by wet etching, is accomplished. The conductor film has a rectangular or virtually rectangular profile in cross section, and it allows a line width vs. line spacing of 1 or greater. The conductor film has a virtually constant line width over the entire range of the height, and the dimensional error is within 0.05 μm on one side and within 0.1 μm over the entire width.

Palladium has the most superior protective effect against corrosion by Cl gas as compared with precious metals such as platinum, gold, iridium and silver and transition metals such as chrome, hafnium, nickel, cobalt, tantalum, and niobium.

(2) Resistivity against electromigration

Electromigration is a phenomena in which an electron current flowing in the Al conductor causes Al atoms to move along the grain boundary of the Al conductor film and, particularly creates voids at grain boundary triple points, which extends until the conductor is broken. By the reinforcement of grain boundaries, particularly grain boundary triple points, of the Al conductor, the resistivity against electromigration can be enhanced. By the addition of palladium by 0.01-3 weight-% to Al and through the heat process, precipitations mainly consisting of fine Al—Pd compound are created on Al grain boundaries. Particularly, through the heat process including the steps of heating at 200°-500° C. for 3-180 minutes, quick cooling, re-heating at a temperature of 350° C. or lower for 10-600 minutes, precipitations are created concentrically on grain boundary triple points, and the resistance against electromigration can be enhanced.

For the precipitation of Al—Pd compound on grain boundary triple points, it is desirable for Al to include palladium by the limit of solid solution or more. The inventors of this invention successfully precipitated $Al_3Pd$ in areas which cover 30% or more of grain boundary triple points by conducting the two-stage heat process of the above-mentioned condition.

(3) Property of contact between the semiconductor substrate and conductor film

When an aluminum alloy conductor film including palladium is deposited on a silicon substrate by evaporation or sputtering, silicon in the substrate diffuses into the conductor film at the contact hole between the substrate and conductor film, resulting in the creation of alloy pits. The alloy pits penetrate the Si diffusion layer, causing a short-circuit between the Al conductor and Si base under the diffusion layer, and eventually the function as a semiconductor device is lost.

In order to prevent silicon from melting into the Al conductor film and to suppress the precipitation of silicon in Al, the interface between Si and Al needs s silicide barrier layer. However, it is yet unknown how to produce silicide from the element added in Al. A trial of annealing at 450° C. for Al alloy films added by transition metals and precious metals revealed successful formation of silicide on a Si contact hole only for Al—Pd based alloys.

For the prevention of silicon in the substrate melting into the Al alloy conductor, the conductor film is made to include silicon, preferably, and it is especially effective when the quantity of silicon is 0.1 weight-% or more, but not in excess of 3 weight-% from the viewpoint of avoiding the breakage of conductor film.

BRIEF DESCRIPTION OF THE DRAWINGS

FIG. 16 is a table showing the relation between the compositions of conductor film material and the life time of conductor to electromigration breakage;

DESCRIPTION OF THE PREFERRED EMBODIMENTS

Embodiments of this invention will now be described with reference to the accompanying drawings.

Figure 1:
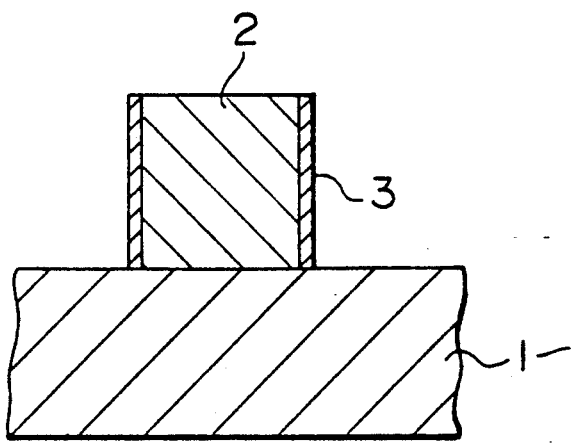
FIG. 1 is a cross-sectional view of the conductor film of the inventive semiconductor device.

FIG. 1 is an enlarged view of the conductor film section of the inventive semiconductor device. Formed on a semiconductor substrate 1 is a conductor film 2 made of aluminum alloy including palladium, with a layer of palladium oxide including C being yielded on the side wall of the dry-etched conductor film. The presence of the layer 3 prevents side etching on the side wall of conductor film during the dry etching process for forming a conductor film pattern.

Figure 2:
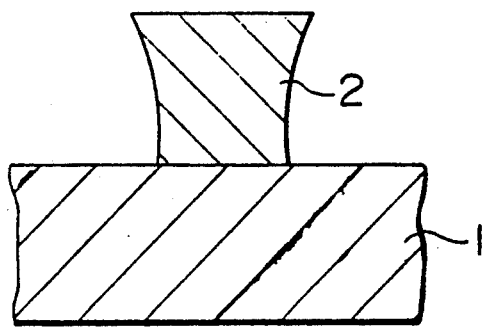
FIG. 2 is a cross-sectional view of the conductor film of the conventional semiconductor device.

FIG. 2 shows, in a sense of model, the over etching of side walls of the conductor film resulting from the dry etching process without the prior heat process offered by this invention.

Figure 3:
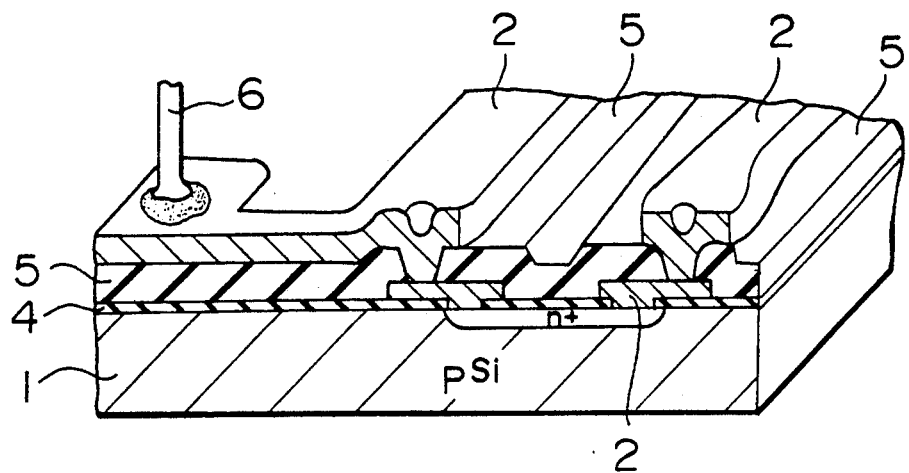
FIG. 3 is a perspective, cross-sectional view of the semiconductor device according to one embodiment of this invention.

FIG. 3 is a cross-sectional diagram showing in part the structure of a semiconductor device, e.g., 4M DRAM or 1M SRAM, based on one embodiment of this invention. In the figure, indicated by 1 is a semiconductor substrate made of silicon for example, 4 is an insulator, with contact holes being formed in it, made of $SiO_2$ film or PSG film with a thickness of 0.1–0.5 $\mu$m for example, and 2 is an Al alloy conductor film made of pure Al or Al including Si added by 0.01–4 weight-% of Pd with a thickness of 0.5–1 $\mu$ for LSI in general.

The Al alloy conductor film 2 contacts with the semiconductor substrate 1 through contact holes. The Al alloy conductor film 2 has its exposed surface protected by a passivation film (not shown), e.g., PSG or PIQ film with a thickness of 0.5–2.0 $\mu$m. The Al alloy conductor film 2 has a bonding pad, and connection is made by ball bonding using metallic wires 6, e.g., copper wires, aluminum wires or gold wires. The ball is created by melting the wire end in the non-oxidative atmosphere and forming it into a ball by utilizing the surface tension.

After the conductor film material has been formed on the semiconductor substrate 1, it is heat processed so that the compound of aluminum with palladium precipitates in the conductor film. The process is followed by dry etching, by which the intended conductor pattern is completed. During dry etching, conductor patterns are covered by a mask, which is preferably a resist mask for example.

Figure 4:
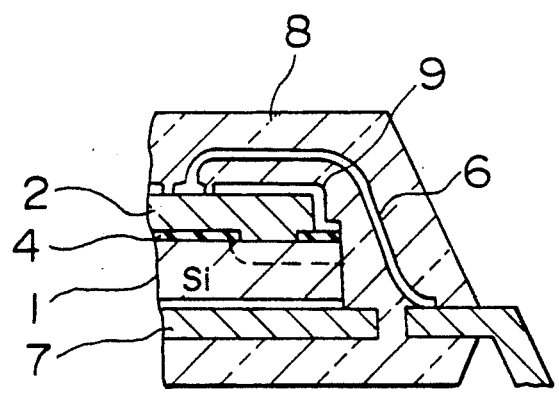
FIG. 4 is a partial cross-sectional view of the resin-molded semiconductor device according to another embodiment of this invention.

FIG. 4 shows the resin-molded semiconductor device, in which a semiconductor substrate having a conductor film is placed on a lead frame 7, with the conductor film 2 and lead frame 7 being connected electrically by a metallic wire 6 and, thereafter sealed with resin 8. Indicated by 9 in the figure is a passivation film.

The metallic wire 6 is preferably a copper wire of pure copper or copper including substantially no additive element, or an aluminum wire of pure aluminum or aluminum without additive element. The lead frame 7 is preferably made of copper or iron-nickel alloy.

Figure 22:
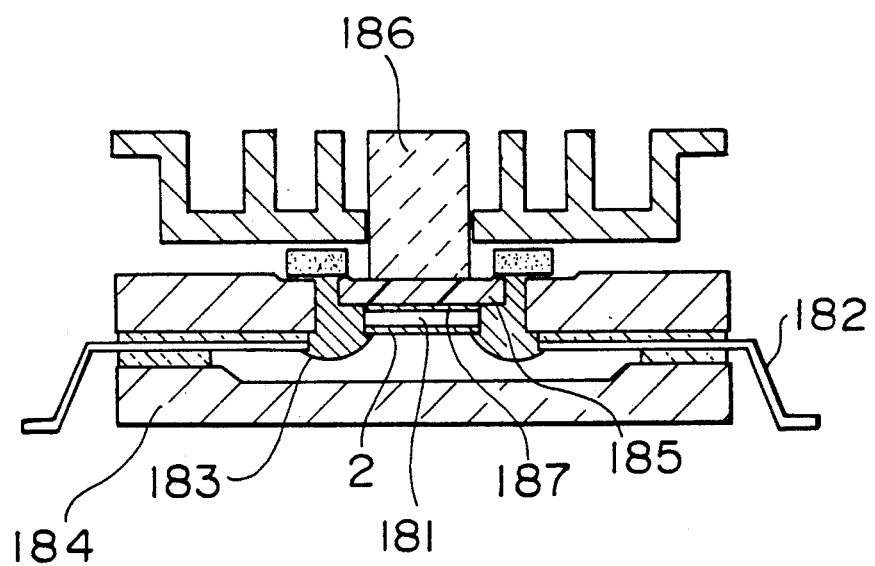
FIG. 22 is a diagram showing an application of this invention to an LSI circuit device.

FIG. 22 shows an application of this invention to an LSI circuit device such as a RAM with a capacity of 4 MB or more or a SRAM with a capacity of 1 MB or more. The device includes a semiconductor substrate 181 in which an LSI circuit is formed, a metallic plate 185, e.g., made of Mo, on which the semiconductor substrate is placed, conductor films 2 fitted on the semiconductor substrate, metallic wires 183 for connecting the conductor films to lead frames 182 electrically, and an electrical insulation cap 184 for providing a hermetical seal for the semiconductor substrate, conductor films and metallic wires. The conductor film 2 is formed in such a manner as described in connection with the preceding embodiment. The conductor film has its side wall cut in a rectangular or virtually rectangular profile, with a protective film including the oxide of Pd included in the conductor film material and C being formed on the side wall surface.

The metallic plate which supports the semiconductor substrate is made up of a molybdenum plate 185 and a gold-plated copper stand 186. The LSI 181 is fixed on the Mo plate by gold plating.

Figure 5A:
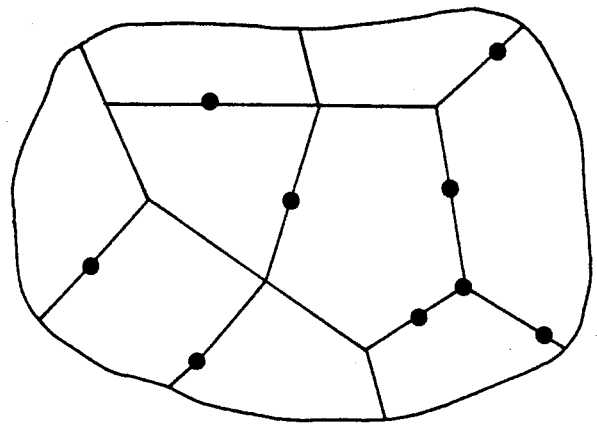
FIGS. 5A and 5B are diagrams showing the crystal structures of the conductor film resulting from the heat processes.
Figure 5B:
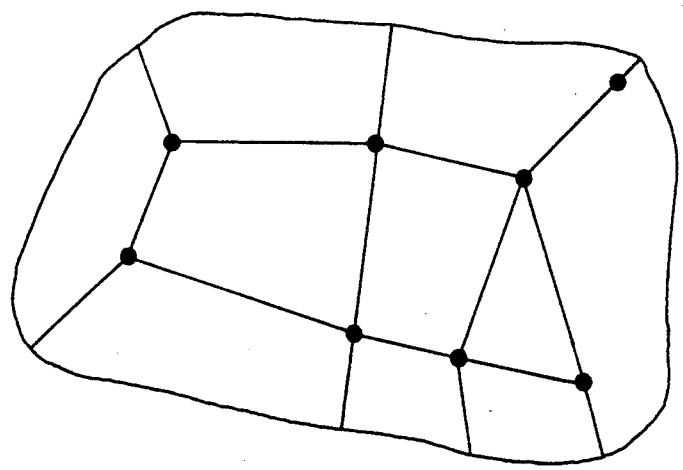

FIG. 5A shows the matrix structure of the conductor film made of Al—1 weight-% Si—0.5 weight-% Pd alloy resulting from the heat process at 450° C. for 30 minutes. FIG. 5B shows the matrix structure of the same conductor film resulting from the second heat processes at 300° C. for 1 hour and at 350° C. for 1 hour following the above-mentioned heat process. The second heat process may be conducted in divided cycles as in this case. In FIG. 5A, precipitations exist on usual grain boundaries, whereas in FIG. 5B, they exist concentrically on grain boundary triple points. Detailed examination of precipitation in both structures revealed that grain boundary precipitations are 90% or more of all in the structure of FIG. 5A, while those on grain boundary are less than 10% in the structure of FIG. 5B.

Figure 6:
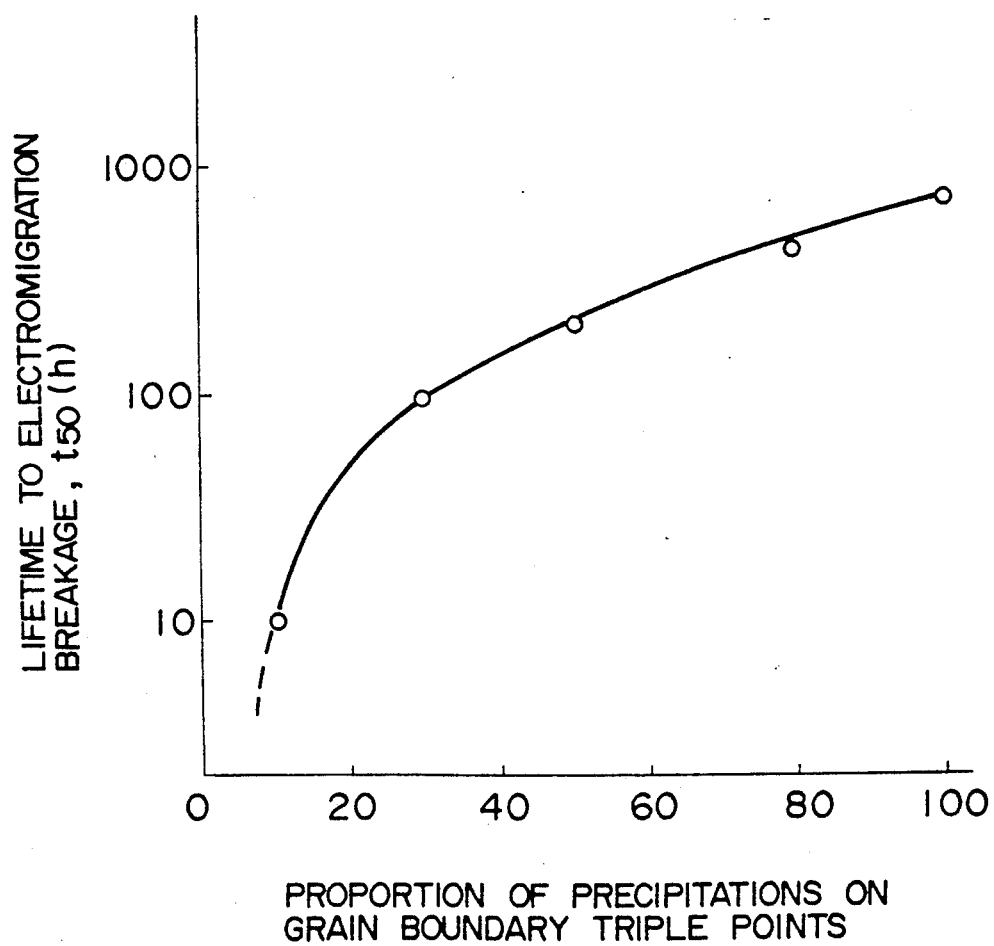
FIG. 6 is a graph showing the relation between the proportion of precipitations of Al—Pd compound on grain boundary triple points and the life time to electromigration failure.
Figure 7:
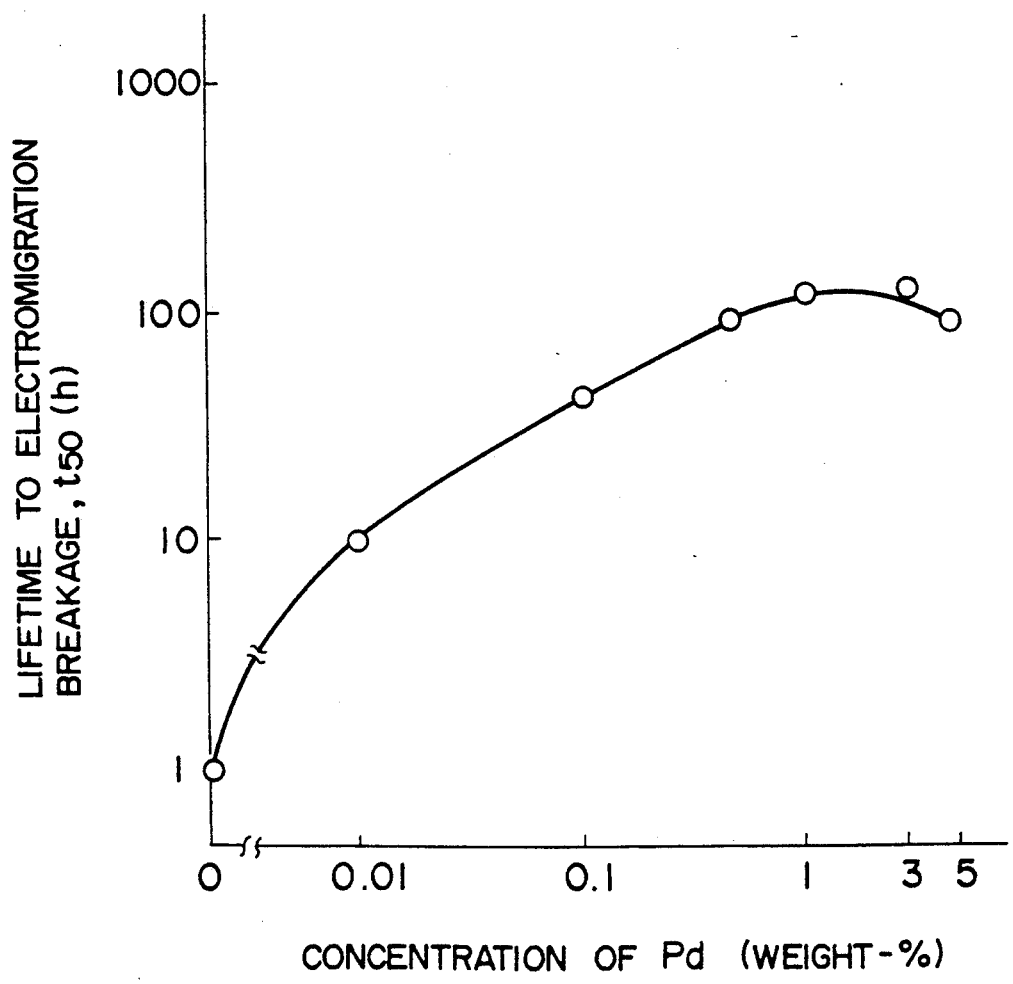
FIG. 7 is a graph showing the relation between the concentration of Pd included in the conductor film material and the life time to electromigration failure.

FIG. 6 shows the relation between the proportion of precipitations located on grain boundary triple points and the mean time $t_{50}$ until the conductor is broken by electromigration when a current of $2 \times 10^6$ A/cm$^2$ is applied to stripes of the same lot. FIG. 7 shows the relation between the mean life time $t_{50}$ and the quantity of Pd addition for the conductor in which 30% of precipitations are located on grain boundary triple points. As indicated on the graph, the addition of Pd by 0.01 weight-% or more is effective. It will be appreciated from FIGS. 6 and 7 that a proper amount of additive Pd is 0.01–3 weight-%, and an increased proportion of precipitations on grain boundary triple points further enhances the resistance against electromigration.

Figure 8:
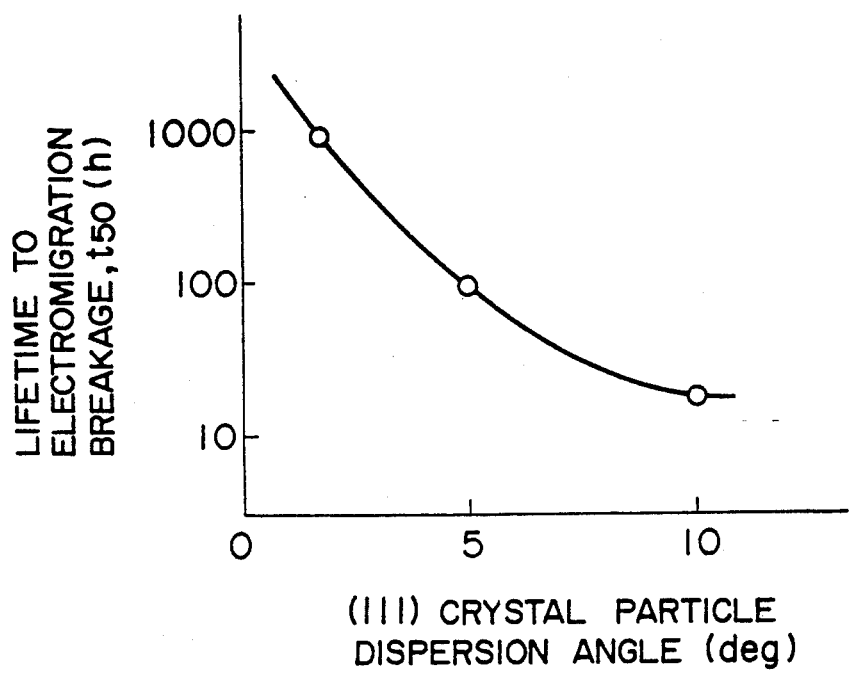
FIG. 8 is a graph showing the relation between the dispersion angle of Al crystal particles and the life time to electromigration breakage.

FIG. 8 shows the relation between the dispersion angle of dominant direction of Al (111) grains and the mean time to breakage for a conductor film of Al—0.5 weight-% Pd—1 weight-% Si alloy after it has been annealed and then subjected to another heat process (precipitation heat process). Aluminum grains are generally polarized on the most stable plane 111, while each grain has its <111> direction deviated slightly from one another. This deviation is measured using the X-rays, and its mean value is defined to be the dispersion angle. A great dispersion angle signifies a great disruption of crystal grain boundaries. As FIG. 8 indicates, the greater the dispersion angle is, the shorter mean time to breakage $t_{50}$ results.

Figure 9:
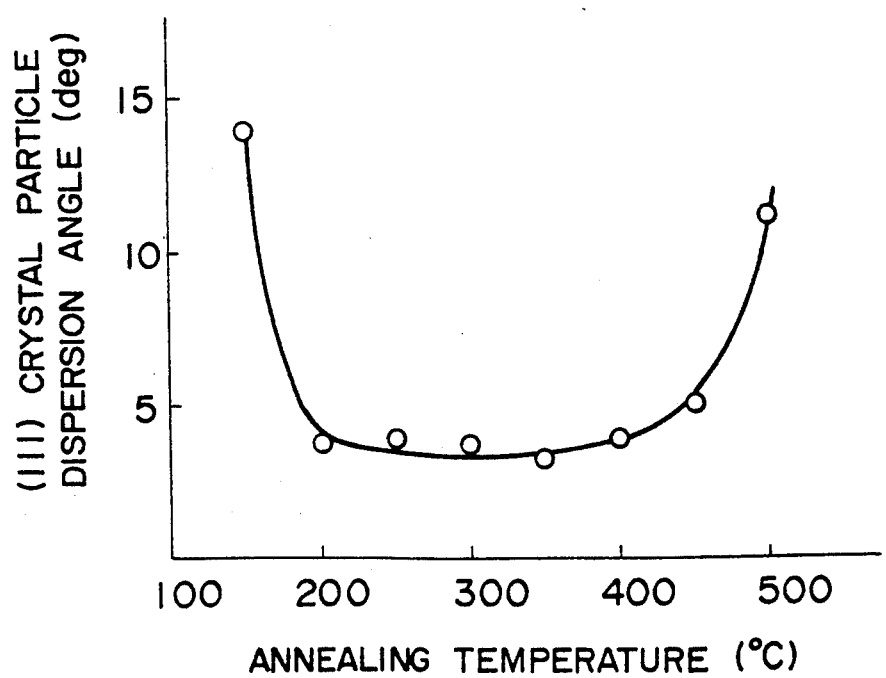
FIG. 9 is a graph showing the relation between the dispersion angle of Al grains and the annealing temperature.
Figure 10A:
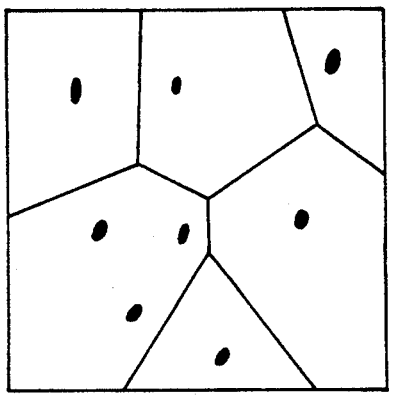
FIGS. 10A through 10D are diagrams showing the matrix structures of the conductor film resulting from the second heat process in different conditions.
Figure 10B:
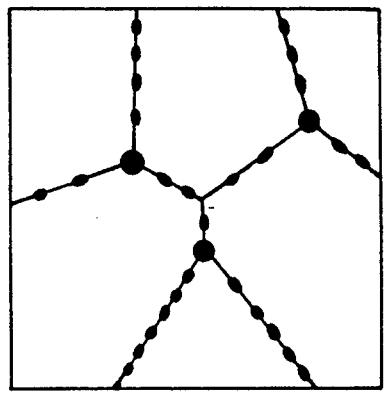
Figure 10C:
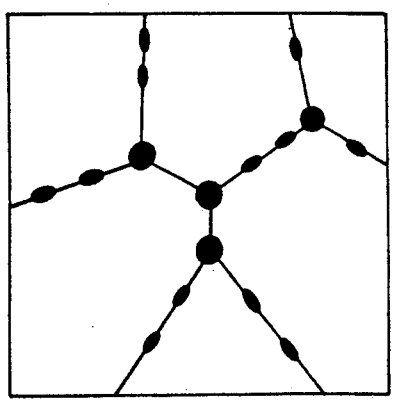
Figure 10D:
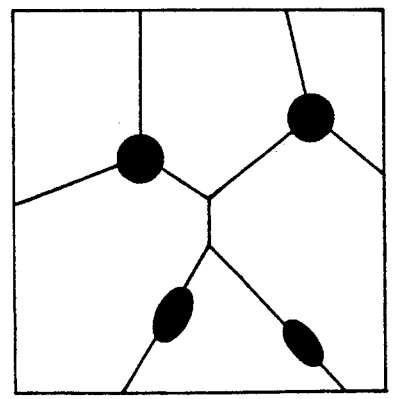

FIG. 9 shows the relation between the dispersion angle and the annealing temperature, and FIG. 10 shows the relation between the precipitation heat process and the matrix structure annealed at 400° C. for 30 minutes. FIG. 9 implies that too low an annealing temperature does not allow re-arrangement of grains, while too high an annealing temperature causes re-crystallization and the dispersion angle does not become smaller. Accordingly, the annealing condition of 200°–450° C. for 3–180 minutes enhances the anti-migration property. On the other hand, FIG. 10 suggests that too low a precipitation heat process temperature does not allow grain boundary precipitation, while too high a temperature causes precipitated particles to be too large, allowing Al atoms to move easily, resulting in a degraded anti-migration property. In conclusion, it was made clear that by setting the precipitation heating condition to 150°–350° C. for 10–600 minutes, the diameter of precipitated particles can be suppressed below 0.3 $\mu$m and the anti-migration property can be enhanced.

Figure 21:
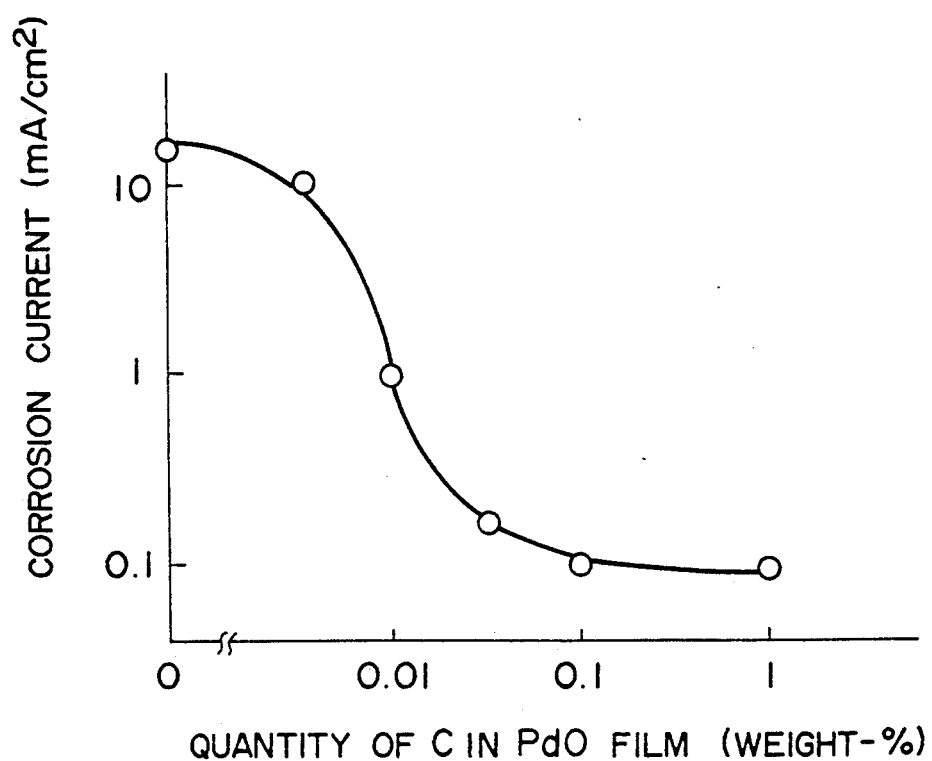
FIG. 21 is a graph showing the relation between the quantity of C included in the PdO film and the corrosion resistance of the conductor.

When a conductor film of the Al—0.5 weight-% Pd—1 weight-% Si alloy is subjected to the two-stage heat process as mentioned above and thereafter it is dry etched for the formation of an intended conductor pattern a layer of palladium oxide is formed on the side wall of the film as shown in FIG. 1. This palladium oxide includes C as mentioned previously, and the quantity of C included can be controlled by adjusting the etching conditions such as atomospheric gas compositions, etching power and/or etching time interval. FIG. 21 shows the relation between the quantity of C and the corrosion current at the natural corrosion voltage in the 100 ppm aqueous solution of Cl ion indicative of the film corrosive property. The figure indicates that the corrosion current decreases to 1/100 as the quantity of C increases to 0.01% or more.

Table 1 shows the reduction of pattern dimension demonstrated by conductor films of 0.5 $\mu$m in thickness formed of several conductor film materials by sputtering and, after the heat process, dry-etched to a line width of 1 $\mu$m. Apparently, the conductor film of the Al—0.5 wt. % (weight-%) Pd—1 wt. % Si alloy attains a minimal reduction of dimension.

TABLE 1

| Conductor material | Reduction of dimension (1 $\mu$m pattern) |
|---|---|
| Al—0.5 wt % Pd—1 wt % Si | 0.05 $\mu$m or less |
| Al—0.5% Pt—1% Si | 0.1 $\mu$m |
| Al—0.5% Cr—1% Si | 0.2 $\mu$m |
| Al—0.5% Hf—1% Si | 0.25 $\mu$m |
| Al—0.5% Zr—1% Si | 0.35 $\mu$m |
| Al—0.5% Cd—1% Si | 0.15 $\mu$m |
| Al—1% Ti—1% Si | 0.2 $\mu$m |
| Al—0.3% W—1% Si | 0.3 $\mu$m |
| Al—0.2% V—1% Si | 0.3 $\mu$m |
| Al—0.2% Ta—1% Si | 0.25 $\mu$m |
| Al—0.3% Co—1% Si | 0.2 $\mu$m |
| Al—0.6% Ni—1% Si | 0.1 $\mu$m |
| Al—0.3% Nb—1% Si | 0.2 $\mu$m |
| Al—0.5% Cu—1% Si | 0.4 $\mu$m |

Figure 11:
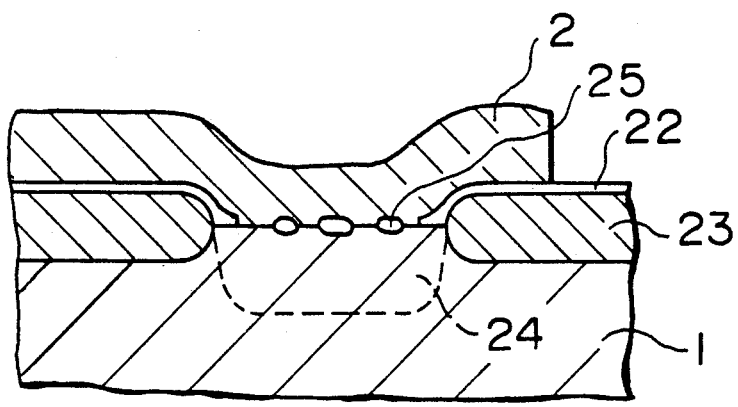
FIG. 11 is a cross-sectional view of the principal portion of the semiconductor device according to another embodiment of this invention.

FIG. 11 is a brief cross-sectional view of the semiconductor device according to one embodiment of this invention. Palladium silicide 25 is formed partly between an Al alloy conductor film 2 and a Si diffusion layer 24. Indicated by 22 is a passivation film, and 23 is a heat-oxidized $SiO_2$ film.

Figure 12A:
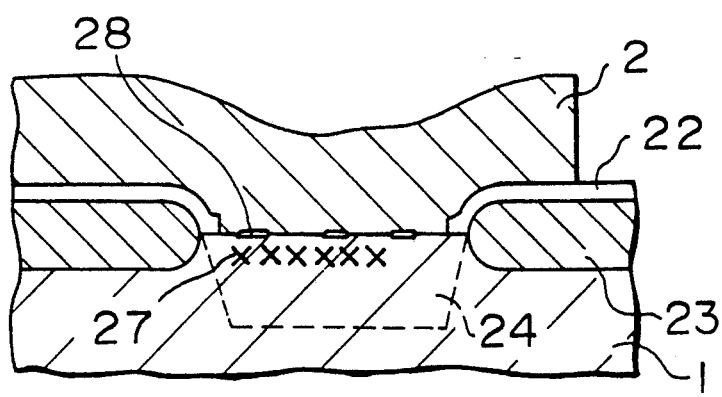
FIGS. 12A, 12B and 12C are cross-sectional views showing changes in the structure of the contact section between the conductor film and diffusion layer resulting from the second heat process according to this invention.
Figure 12B:
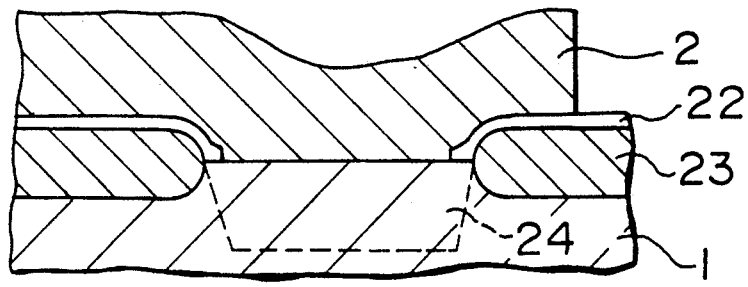
Figure 12C:
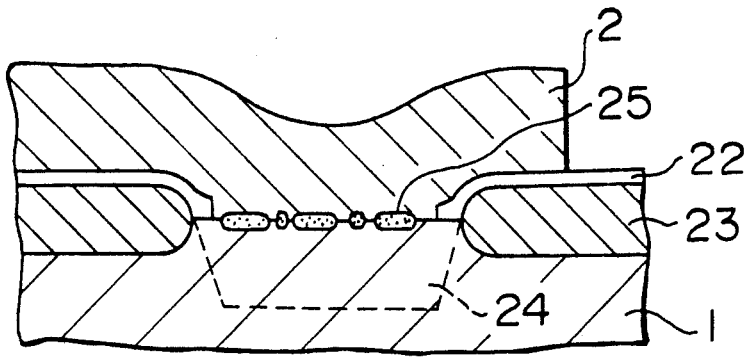

FIGS. 12A–12C show, as an example, the fabricating process of the inventive semiconductor device. Initially, a conventional conductor film of Al—1 weight-% Si—1 weight-% Pd alloy is formed on a semiconductor substrate 1 by sputtering, and a conductor pattern is formed through the photo-etching process, as shown in Fig. 12A. At this stage, lattice defects 27 created by sputtering for the conductor film material are left inside the diffusion layer 24 and an oxide film 28 is left on the surface of the diffusion layer 24. Next, annealing is conducted at 400° C. for 30 minutes. This process recovers the defects 27 of sputtering to form a good ohmic contact, as shown in FIG. 12B. A natural oxide film 28 left on the surface of the Al alloy conductor film at its deposition is reduced by Al, and the semiconductor substrate has a clean Si surface. After that, another heat process is conducted at 200° C. for 2 hours. Consequently, Pd in the Al alloy concentrates on the Si interface, where it reacts with Si to yield silicide, as shown in FIG. 12C.

Figure 13:
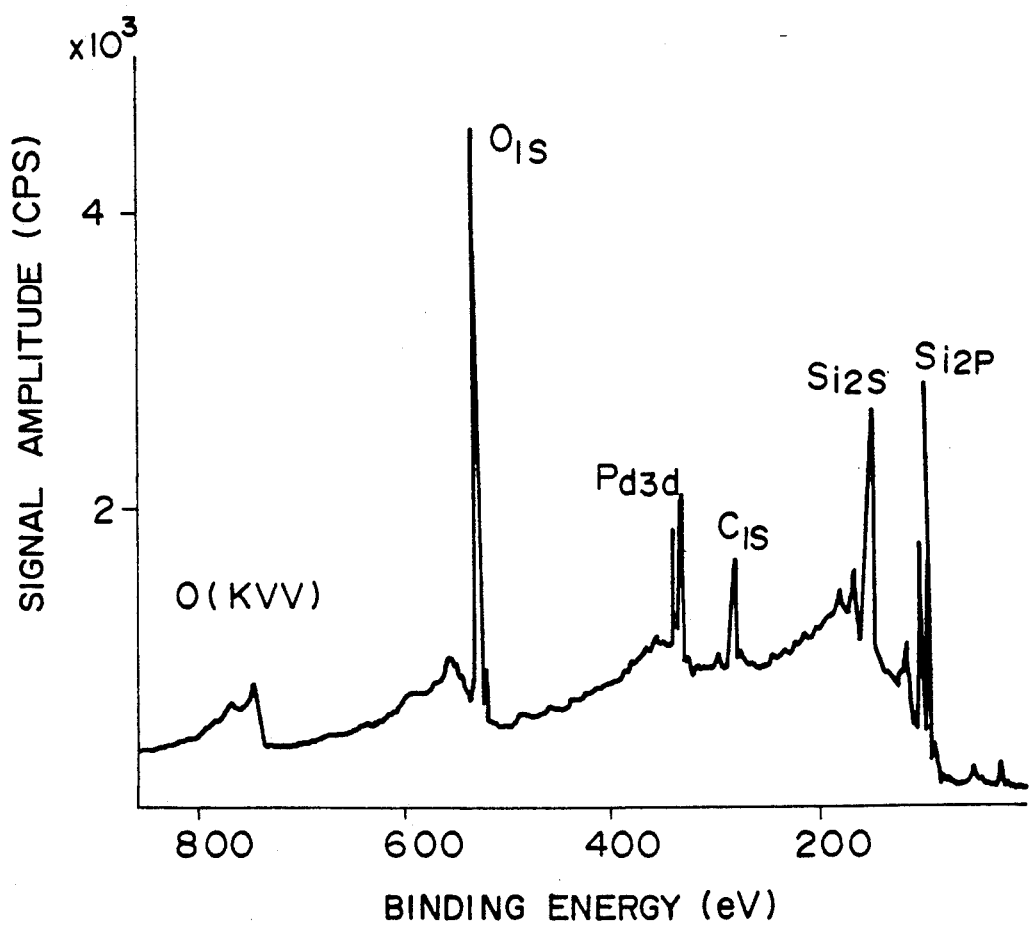
FIG. 13 is a graph showing the result of XPS analysis conducted for the Si contact hole area after the second heat process at 200° C. for 2 hours and after the Al alloy film has been etched off.
Figure 14:
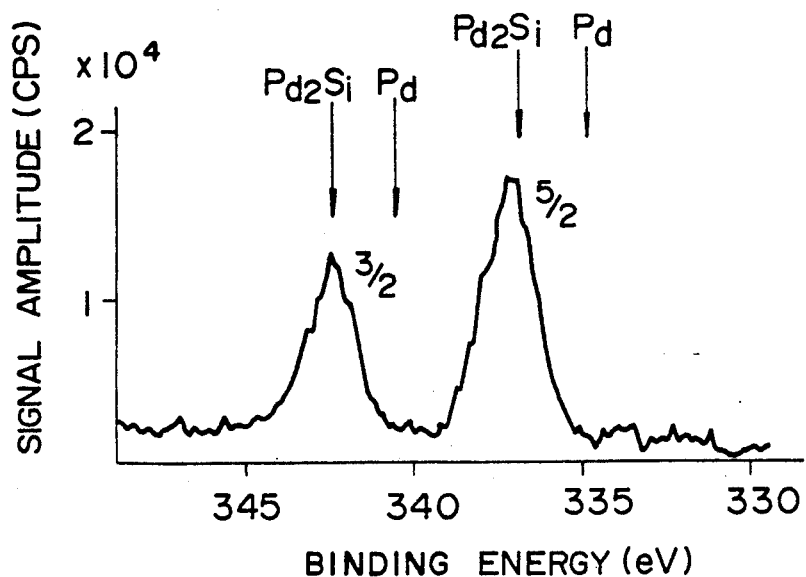
FIG. 14 is a graph showing the result of the detailed measurement for Pd3d in FIG. 13.

FIG. 13 shows the result of X-ray photoelectron spectroscopy (XPS) on the Si interface after the overlying Al alloy film has been etched off. The Al alloy and Al metallic compound are removed by etching, while precipitations to other interfaces remain and they are detected by the XPS analysis. Among the elements Pd, Si, O and C detected, O and C are derived from the contamination on the Si surface sustained in the etching process. A further detailed examination on the detected Pd3d5/2 peak revealed that the Pd forms $Pd_2Si$ as shown in FIG. 14. The face that the $Pd_2Si$ peak of FIG. 14 was not intensified by annealing at 400° C. for 2 hour or longer suggests that the Si interface is completely covered with $Pd_2Si$ by the annealing of this condition. Precipitation of Si to the Si interface is not detected. A further heat process at 200° C. for 60 minutes does not result in the Si precipitation, and there is virtually no change in the contact resistance.

Table 2 shows the proportion of area of $Pd_2Si$ which covers the Si interface, with the heat process of 200° C. being shortened to 60 minutes and 30 minutes, evaluated from the XPS spectrum intensity.

TABLE 2

| Heat Condition | Relative value of Pd3d5/2 peak area (The value is 1 when annealing at 200° C., 2 hours) | Proportion of Pd$_2$Si on Si interface (%) |
|---|---|---|
| 200° C., 30 minutes | 0.2 | 20 |
| 1 hour | 0.5 | 50 |
| 2 hours | 1 | 100 |
| 3 hours | 1.0 | 100 |
| 4 hours | 1.05 | 100 |

The 30-minute re-heating does not make 80% of Si interface to become silicide, and the following annealing at 450° C. for 60 minutes does not cause Si precipitations to grow. As a result, the contact resistance increased by only 77% before and after the annealing at 450° C. for 60 minutes. This resistance increase is half or less the case of the conventional technique using Al—1 weight-% Si alloy, presenting the effectiveness of this invention. The silicide formation is effective even if it does not cover the entire Si interface.

Figure 15:
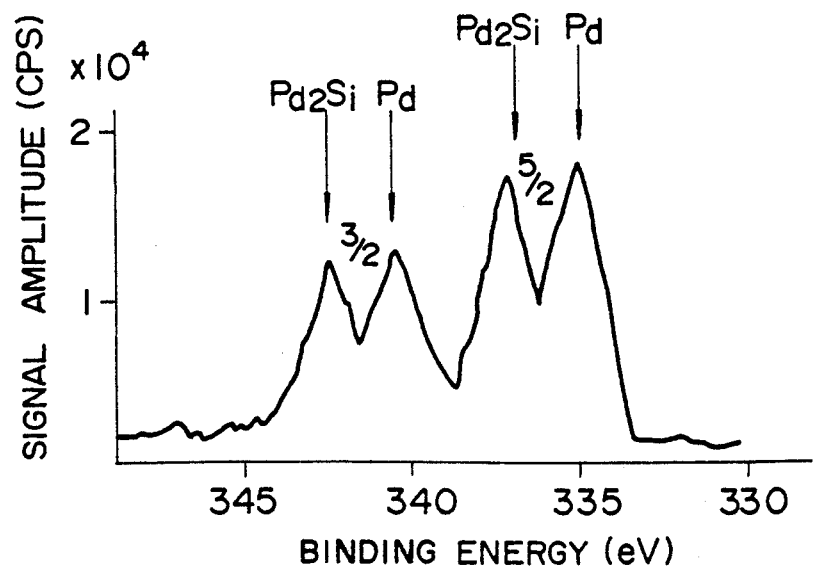
FIG. 15 is a graph showing the result of XPS spectrum measurement conducted in the same procedure as FIG. 14 for Pd3d after the second heat process at 200° C. for 2 hours.

FIG. 15 shows the XPS spectrum on the Si interface after the heat process which is conducted in this case by lowering the re-heating temperature of 200° C. to 150° C. for a duration of 2 hours. In this case, precipitations of pure Pd occur on the interface besides Pd$_2$Si. A successive annealing at 450° C. for 60 minutes causes the precipitations of pure Pd to be absorbed back into the Al alloy film, resulting in a weakened suppression effect against Si precipitation. However, even in this case, a sufficient amount of Pd$_2$Si is formed on the interface to effectively suppress Si precipitation, as shown in Table 3.

TABLE 3

| Process Condition | Contact resistance before 450° C., 60 min. annealing ra (1.2 μm □ CONT) | Contact resistance after 450° C., 60 min. annealing rb | Increase in contact resistance (rb − ra)/ra (%) | Proportion of Si precipitations on contact interface after 450° C., 60 min. annealing (%) |
|---|---|---|---|---|
| Al—Pd—Si | | | | |
| 200° C. 30 min | 22 Ω | 39 Ω | 77 | 10 |
| 1 hour | 24 | 35 | 45 | 7 |
| 2 hours | 26 | 30 | 15 | <5 |
| 150° C. 2 hours | 24 | 40 | 66 | 15 |
| Al—1% Si 400° C., 30 min. Ohmic formation only | 20 | 60 | 200 | >30 |

In this embodiment, silicide needs to be formed as uniformly as possible at a low temperature. Table 4 lists a variety of silicides which can be formed at relatively low temperatures.

TABLE 4

| Silicide | Forming temperature (°C.) |
|---|---|
| Mg$_2$Si | ≧200 |
| Co$_2$Si | 350–500 |
| CoSi | 400–500 |
| Ni$_3$Si | ≧200 |
| Ni$_5$Si$_2$ | ≧200 |
| Ni$_2$Si | 200–350 |
| NiSi | 350–750 |
| Pd$_2$Si | ≧100 |
| Pt$_2$Si | 200–500 |
| PtSi | ≧300 |

Besides Pd which forms silicide at the lowest temperature, another element which forms only one type of silicide at a low temperature is Mg, but Mg easily forms solid solution with Al when added to it and does not emerge on the Si interface.

Although the foregoing embodiments use conductor film materials of Al alloys in which Pd or Si is dispersed, the same effect is achieved by using a conductor film material of Al alloy in which Pt, or Pt and Si is dispersed.

The conductor film material is desirably deposited by chemical vapor deposition (CVD), electron beam (EB) evaporative deposition, or sputtering. When the sputtering method is chosen, use of a target, with the concentration distribution of additive element being controlled within ±0.05%, is recommended to produce a uniform Al conductor film with outstanding characteristics.

Next, another embodiment will be described, in which the conductor film material based on aluminum or aluminum including silicon by less than 3 weight-% including less than 5 weight-% of palladium or platinum as additive element, further includes at least one of lithium, beryllium, magnesium, manganese, iron, cobalt, nickel, copper, lanthanum, cerium, chrome, hafnium, zirconium, cadmium, titanium, tungsten, vanadium, tantalum, and niobium by less than 5 weight-% as additional additive element.

The above material is deposited on a semiconductor substrate by sputtering, and the anneal process at 400°–500° C. for 10 minutes or longer is conducted as a first-stage heat process thereby to form a solid solution of the additive elements on the Al matrix. Then the whole substrate is cooled quickly at a rate of 10° C./sec so that the Al matrix becomes a super-saturated solid solution of the additive elements. Next, the precipitation heat process is conducted at 350° C. or lower for 20–60 minutes so that the super-saturated solid solution makes precipitates as a fine compound, and thereafter another heat process is conducted at the same annealing temperature for 10 minutes or less so that the additive elements are made into solid solution again in the Al matrix.

The Al conductor film formed as described above initially includes precipitations of metallic compound between palladium or platinum and aluminum, and, as the time passes on, the electron current flowing in the conductor causes the other additive element in solid solution to precipitate successively. Consequently, a fine conductor film with a line width of 2 μm or less has its resistances against electromigration and stress migration, respectively, enhanced significantly.

FIG. 16 compares the life time to breakage resulting from electromigration of the conductor films formed by the inventive method described above and those formed by the conventional method, the test being based on the current conduction at a high temperature. In the figure, three rows in the upper section are the test results for the conductor films formed by the conventional method. The life time of conductor evaluated here is defined to be the time length at which a half of the test samples are broken. As shown clearly in FIG. 16, the inventive Al alloy conductors are superior in life time to the conventional conductors.

Figure 17A:
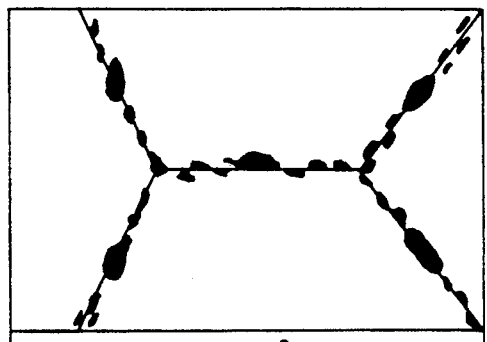
FIGS. 17A through 17D are diagrams showing the structures of conductor films resulting from the inventive heat process and the conventional heat process.
Figure 17B:
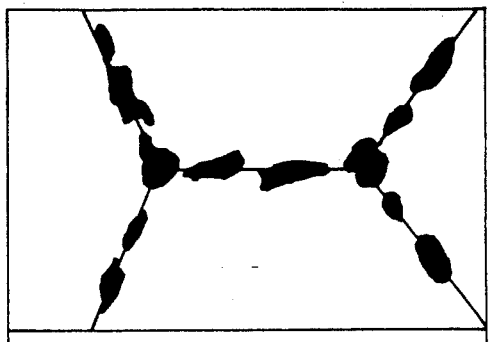
Figure 17C:
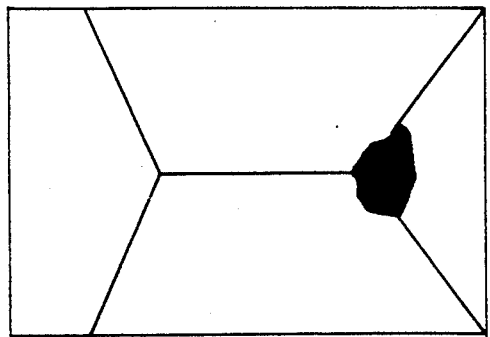
Figure 17D:
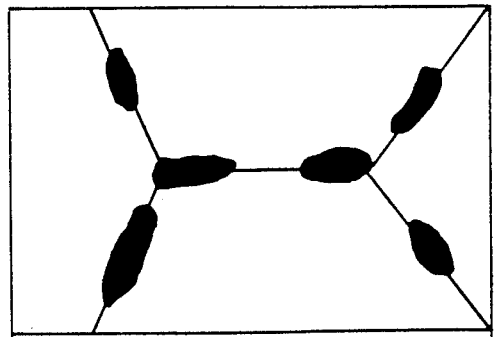

FIG. 17A shows the grain boundary structure of the Al alloy conductor film based on the foregoing inventive heat process, and FIGS. 17B, 17C and 17D show the grain boundary structure of the Al—Si, Al—Pd—Si and Al—Pd—Cu—Si conductor materials, respectively, based on the conventional heat process at 450° C. for 1 hour. The Al alloy film structures were observed after the application of current at a high current density of $8 \times 10^6$ A/cm$^2$ for 3 hours. According to this invention, both coarse precipitations and fine precipitations emerge on grain boundaries, standing for the occurrence of fine precipitation reaction. In contrast, the other three samples exhibit over-growing precipitations, and therefore the suppression of the diffusion through grain boundaries by dislocation pinning effect is lost.

Figure 18:
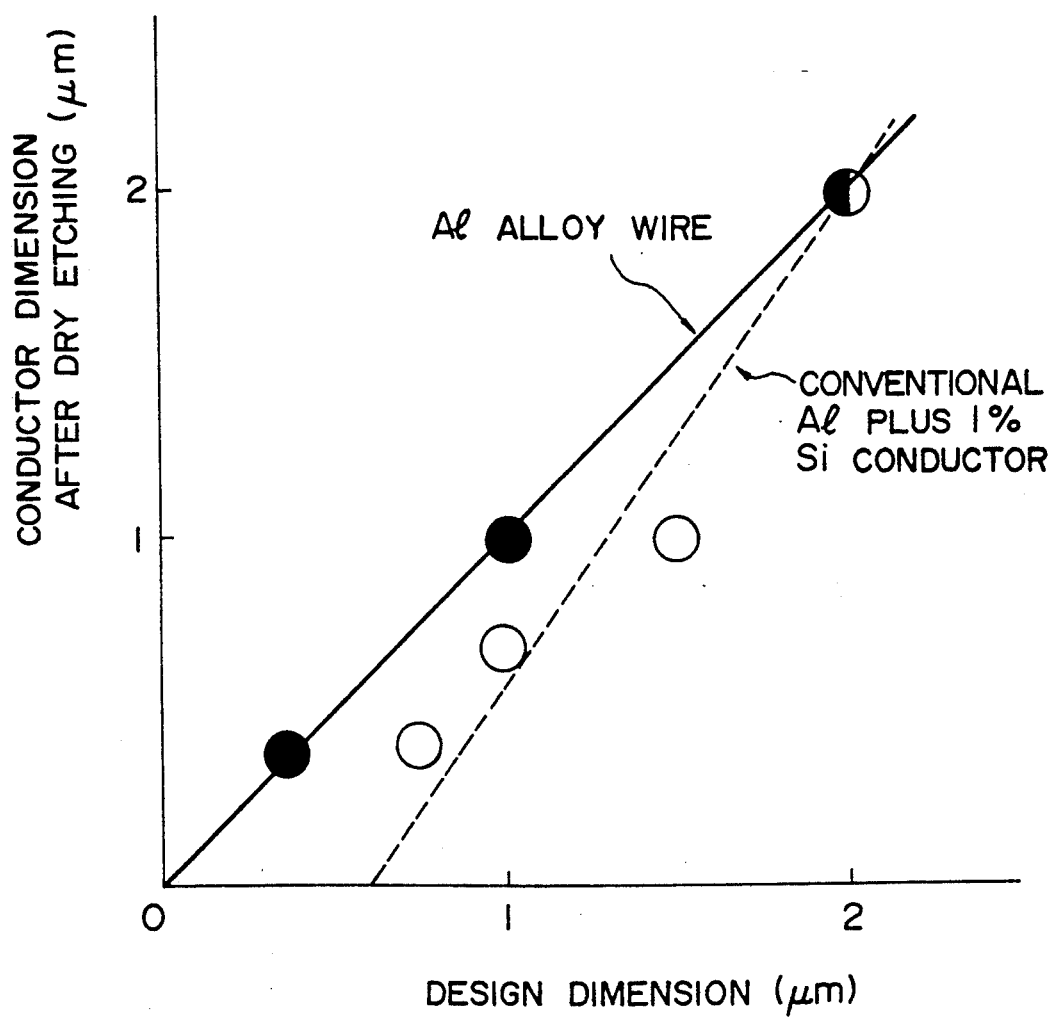
FIG. 18 is a diagram comparing the dimensions of conductor films after dry etching conducted by the inventive technique and conventional technique.

FIG. 18 shows the pattern dimension accuracy after dry etching using chlorine-based gas for the Al alloy conductor based on the embodiment of this invention and the conventional Al plus Si conductor. As shown clearly in FIG. 18, which compares the Al alloy conductor based on the embodiment of this invention with the conventional Al plus Si conductor, the property of formation based on the embodiment is superior particularly for semiconductor devices, e.g., 4M DRAM and 1M SRAM, where the pattern dimension is 1 μm or smaller.

Figure 19:
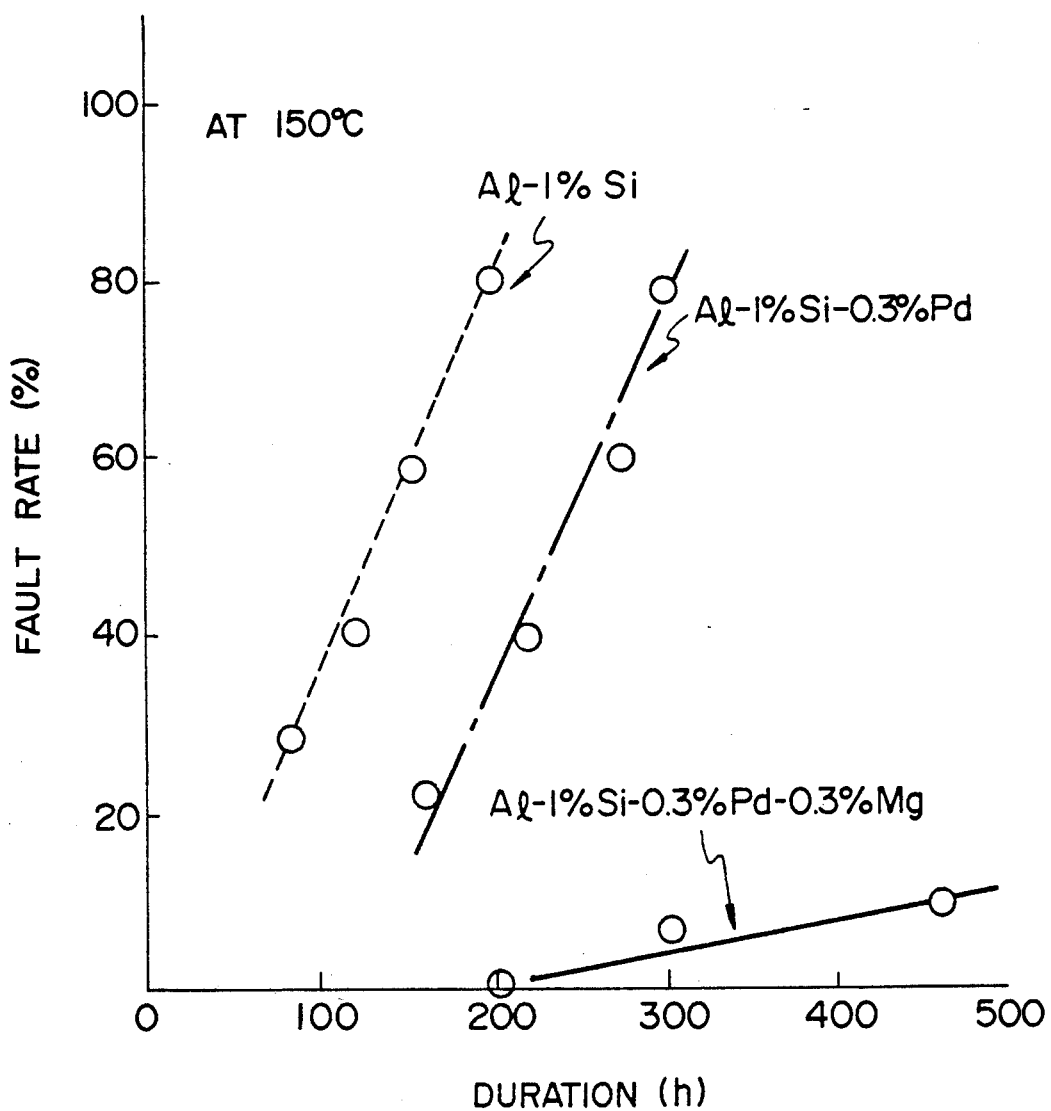
FIG. 19 is a diagram comparing the fault rates in connection with stress migration breakage resulting from the inventive technique and conventional technique.

FIG. 19 shows the result of examination on the cumulative fault rate attributable to stress migration for the conventional Al—Si conductor and Al—Pd—Si conductor and for the Al—Pd—Mg—Si conductor based on the embodiment of this invention. As indicated clearly in FIG. 19, the addition of Mg enhances the stress migration resistance significantly. The same effectiveness is achieved by the addition of at least one of the aforementioned additive elements besides Mg.

Figure 20:
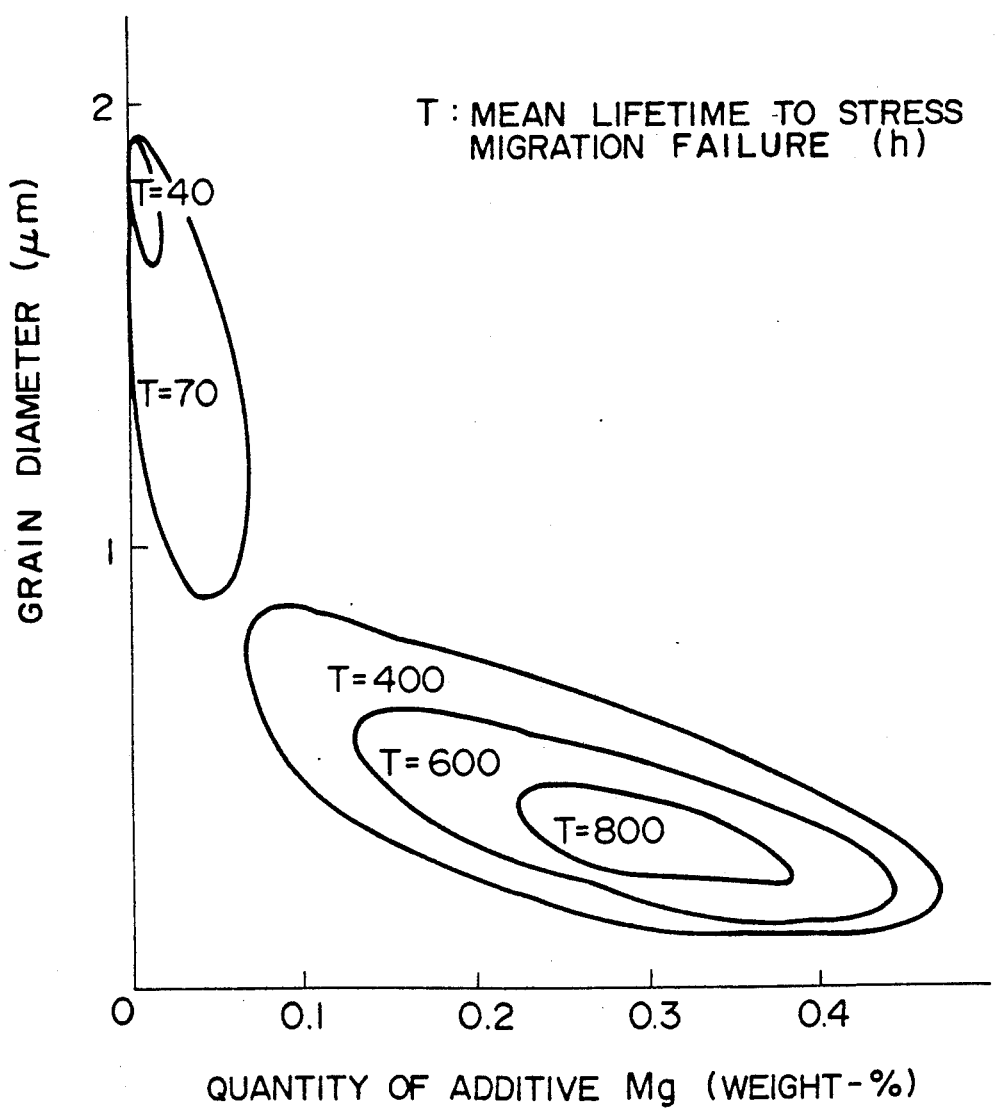
FIG. 20 is a graph showing the relation between additive elements and the life time of conductor to stress migration breakage.

FIG. 20 shows the change in the life time of conductor to stress migration failure when the Al—Pd—Si conductor film to which is added Mg is heat processed as described above so that grains are made smaller than the conductor width (0.8 μm). As shown clearly in FIG. 20, samples with the addition of more Mg and having smaller grains are higher in stability, and samples having grain diameters larger than the conductor width are shorter in life to stress migration failure.

A conceivable reason is that the stress migration breakage is caused by the grain boundary diffusion of Al atoms ascribed to the tensional stress, and, in case of comparable dimensions of the conductor and Al grains, grain boundary diffusion occurring at one position has an increased possibility of being destined to failure. A finer grain dimension is also accomplished by use of the aforementioned additive elements besides Mg. The reason for the grain diameter to become smaller than 1 μm is conceivably re-crystallization of Al matrix which takes place in, among the inventive heat process, the short-term re-heating at the annealing temperature following the precipitation process.

We claim:

1. A semiconductor device having a semiconductor substrate and a plurality of conductor films formed on said substrate, each of said conductor films being made of aluminum alloy including on element selected from palladium and platinum, with a protective film which includes oxide of the selected one of palladium and platinum together with carbon being formed on the side wall of said conductor film.

2. A semiconductor device according to claim 1, wherein said aluminum alloy has a principal component of aluminum and includes palladium by 5 weight-% or less.

3. A semiconductor device according to claim 1, wherein said aluminum alloy has a principal component of aluminum and includes palladium by 5 weight-% or less and silicon by 0.1-3 weight-%, and said protective film includes palladium oxide and carbon.

4. A semiconductor device having a semiconductor substrate and a plurality of conductor films formed on said substrate, each of said conductor films being made of aluminum alloy including aluminum as a principal component and one element selected from palladium and platinum by 5 weight-% or less, and having a line width of 1.3 μm or less, with a protective film which includes oxide of the selected one of palladium and platinum together with carbon being formed on the side wall of said conductor film.

5. A semiconductor device having a semiconductor substrate and a plurality of conductor films formed on said substrate, each of said conductor films being made of aluminum alloy including palladium by 5 weight-% or less and having a line width of 1.3 μm or less and a line width vs. line spacing ratio of 1 or more, with a film which includes palladium oxide and carbon being formed on the side wall of said conductor film.

6. A semiconductor device having a semiconductor substrate and a plurality of conductor films formed on said substrate, each of said conductor films being made of aluminum alloy including palladium by 5 weight-% or less, with a film which includes palladium oxide and carbon being formed on the side wall of said conductor films, said conductor films having a line width of 1.3 μm or less which is substantially constant over the entire range of the height of said conductor film.

7. A semiconductor device according to claim 6, wherein said conductor films have a dimensional error of line width, measured along the height direction of conductor film, of 0.1 μm or less.

8. A semiconductor device having a semiconductor substrate and a plurality of conductor films formed on said substrate, each of said conductor films being made of aluminum alloy including an element selected from palladium and platinum by 0.01-3 weight-%, with a film which includes oxide of the selected one of palladium and platinum yielded by dry etching being formed on the side wall of said conductor film.

9. A semiconductor device having a semiconductor substrate and a plurality of conductor films formed on said substrate, each of said conductor films being a sputtered film of aluminum alloy including an element selected from palladium and platinum by 0.01-3 weight-% or less, with a film which includes oxide of the selected one of palladium and platinum yielded by dry etching being formed on the side wall of said conductor film.

10. A semiconductor device having a semiconductor substrate and a plurality of conductor films formed on said substrate, each of said conductor films being made of aluminum alloy including palladium by 5 weight-% or less, with precipitations of pure palladium or metallic compound thereof being dispersed on grain boundaries and in grains of said alloy, and with a film which includes palladium oxide and carbon being formed on the side wall of said conductor film.

11. A semiconductor device according to claim 10, wherein said precipitations of pure palladium or metallic compound thereof being dispersed in 30% or more of areas of triple points of said grain boundaries.

12. A semiconductor device according to claim 11, wherein said precipitations have particle diameters of 0.3 μm or less.

13. A semiconductor device having a silicon substrate and a plurality of conductor films formed on said substrate, each of said conductor films being made of aluminum alloy including palladium by 5 weight-% or less, with a film which includes palladium oxide yielded at conductor formation by dry etching being formed on the side wall of said conductor film, and with precipitations of aluminum silicide yielded as a coupling of said silicon substrate and palladium in said conductor film being included on the interface of said conductor films and said silicon substrate.

14. A semiconductor device having a silicon substrate and a plurality of conductor films formed on said substrate, each of said conductor films being made of aluminum alloy including palladium by 5 weight-% or less, with precipitations of pure palladium or metallic compound thereof being included in 30% or more of areas of grain boundary triple points of said alloy, with precipitations of palladium silicide yielded as a coupling of palladium in said conductor film and silicon being included on the interface between said conductor films and said silicon substrate, and with a film which includes palladium oxide yielded at conductor formation by dry etching being formed on the side wall of said conductor film.

15. A resin-molded semiconductor device comprising a semiconductor substrate, a plurality of conductor films formed on said semiconductor substrate, lead frames which mount said semiconductor substrate, metallic wires for making electrical connection between said conductor films and said lead frames, and resin which seals surroundings of said semiconductor substrate, with said conductor film being formed thereon, and said metallic wires, each of said conductor films being made of aluminum alloy including palladium by 5 weight-% or less, with precipitations of compound between palladium and aluminum emerging in said alloy, and with a film which includes palladium oxide yielded by dry etching at the formation of conductors being formed on the side wall of said conductor film.

16. A resin-molded semiconductor device according to claim 15, wherein said aluminum alloy has a principal component of aluminum and includes palladium by 0.01–3 weight-%.

17. A resin-molded semiconductor device according to claim 15, wherein said aluminum alloy has a principal component of aluminum and includes palladium by 0.01–3 weight-% and silicon by 0.1–3 weight-%.

18. A resin-molded semiconductor device according to claim 15, wherein said semiconductor substrate is made of silicon, with precipitations of metallic compound yielded as a coupling of silicon in said substrate and palladium in said conductor film emerging on the interface between said substrate and said conductor films.

19. A semiconductor device comprising a semiconductor substrate, a plurality of conductor films formed on said semiconductor substrate, lead frames which mount said semiconductor substrate, and metallic wires for making electrical connection between said conductor films and said lead frames, each of said conductor films being made of aluminum alloy including palladium by 0.01–3 weight-%, with precipitations of compound between palladium and aluminum being included in said alloy, and with a film which includes palladium oxide yielded by dry etching at the formation of conductors being formed on the side wall of said conductor film.

20. A semiconductor device according to claim 19, wherein said metallic wires are substantially made of copper or aluminum.

21. A semiconductor device according to claim 19, wherein said lead frames are made of copper or iron-nickel alloy.

22. A semiconductor device according to claim 19, wherein each said metallic wires has at one end thereof a ball formed by melting in non-oxidative atmosphere, said ball being in electrical connection with said conductor film, each said metallic wires having another end connected to said lead frame by wedge bonding.

23. A semiconductor device comprising a semiconductor substrate, and a plurality of conductor films formed on said substrate, each of said conductor films being made of aluminum alloy including palladium, with a protective layer which includes palladium oxide and carbon being formed on the side wall of said conductor film.

24. A semiconductor device according to claim 23, wherein said protective film has a thickness of 100 nm or less.

25. A semiconductor device comprising a semiconductor substrate, and a plurality of conductor films formed on said substrate, each of said conductor films being made of aluminum alloy including palladium, with a protective layer which includes palladium oxide and carbon being formed on the side wall of said conductor film.

26. A semiconductor integrated circuit comprising a semiconductor substrate and an integrated circuit in DRAM configuration including memory elements of 4M bits or more formed on said semiconductor substrate and a plurality of conductor films connected with said memory elements, each of said conductor films being made of aluminum alloy including palladium, with a protective film which includes palladium oxide being formed on the side wall of said conductor film.

27. A semiconductor integrated circuit comprising a semiconductor substrate and an integrated circuit in SRAM configuration including memory elements of 1M bits or more formed on said semiconductor substrate and a plurality of conductor films connected with said memory elements, each of said conductor films being made of aluminum alloy including palladium, with a protective film which includes palladium oxide being formed on the side wall of said conductor film.

28. A semiconductor device comprising a semiconductor substrate and a plurality of conductor films formed on said semiconductor substrate, each of said wiring films being made of aluminum alloy including a first additive element selected from palladium and platinum by 5 weight-% or less and at least one second additive element selected from lithium, beryllium, magnesium, manganese, iron, cobalt, nickel, copper, lanthanum, cerium, chrome, hafnium, zirconium, cadmium, titanium, tungsten, vanadium, tantalum, and niobium by 5 weight-% or less, with a protective film which includes oxide of said first additive element together with carbon being formed on the side wall of said conductor film.

29. A semiconductor device according to claim 28, wherein said first additive element forms metallic compound with aluminum, with precipitations with particle diameters of 0.3 μm or less dispersing on grain boundaries, and with at least one of said second additive elements forming solid solution in the aluminum matrix.

30. A semiconductor device according to claim 29, wherein precipitations of the selected at least one of said second additive elements emerge on grain boundaries or in the aluminum matrix.

31. A semiconductor integrated circuit comprising a semiconductor device having a semiconductor substrate and a plurality of conductor films formed on said substrate, each of said conductor films being made of aluminum alloy including one element selected from palladium and platinum, with a protective film which includes oxide of the selected one of palladium and platinum together with carbon being formed on the side wall of said conductor films.

32. A semiconductor memory circuit comprising a semiconductor device having a semiconductor substrate and a plurality of conductor films formed on said substrate, each of said conductor films being mae of aluminum alloy including one element selected from palladium and platinum, with a protective film which includes oxide of the selected one of palladium and platinum together with carbon being formed on the side wall of said conductor film.

33. A semiconductor device according to claim 8, wherein said film includes carbon yielded by said dry etching.

34. A semiconductor device according to claim 9, wherein said film includes carbon yielded by said dry etching.

35. A semiconductor device according to claim 13, wherein said film includes carbon yielded by said dry etching.

36. A semiconductor device according to claim 14, wherein said film includes carbon yielded by said dry etching.

37. A semiconductor device according to claim 15, wherein said film includes carbon yielded by said dry etching.

38. A semiconductor device according to claim 19, wherein said film includes carbon yielded by said dry etching.

39. A semiconductor device comprising:
a semiconductor substrate; and
a plurality of conductor films formed on said substrate, each of said conductor films being made of an aluminum alloy containing at least one element selected from the group consisting of palladium and platinum;
wherein each of said conductor films has a protective film formed on side wall surfaces thereof, said protective film including carbon and an oxide of said at least one element; said semiconductor device being produced by a process comprising the following series of steps:
depositing a layer of said aluminum alloy on said substrate;
conducting a first stage heat process for annealing said layer of aluminum alloy;
conducting a second stage heat process to precipitate a metallic compound between aluminum and said at least one element in said layer of aluminum alloy; and
dry etching said layer of aluminum alloy to form said plurality of conductor films, each having said protective film formed thereon.

* * * * *